United States Patent
Saklang et al.

(10) Patent No.: US 10,790,220 B2
(45) Date of Patent: Sep. 29, 2020

(54) PRESS-FIT SEMICONDUCTOR DEVICE

(71) Applicant: NXP B.V., Eindhoven (NL)

(72) Inventors: Chayathorn Saklang, Bangplee (TH); Stephen Ryan Hooper, Mesa, AZ (US); Chanon Suwankasab, Pathumthani (TH); Amornthep Saiyajitara, Bangken (TH); Bernd Offermann, Hamburg (DE); James Lee Grothe, Gilbert, AZ (US); Russell Joseph Lynch, West Bloomfield, MI (US)

(73) Assignee: NXP B.V., Eindhoven (NL)

( * ) Notice: Subject to any disclaimer, the term of this patent is extended or adjusted under 35 U.S.C. 154(b) by 13 days.

(21) Appl. No.: 16/164,776

(22) Filed: Oct. 18, 2018

(65) Prior Publication Data

US 2020/0126895 A1    Apr. 23, 2020

(51) Int. Cl.
   *H01L 23/495*   (2006.01)
   *H01L 23/31*    (2006.01)
   *H01L 21/56*    (2006.01)
   *H01R 12/58*    (2011.01)

(52) U.S. Cl.
   CPC ...... *H01L 23/49541* (2013.01); *H01L 21/563* (2013.01); *H01L 23/3107* (2013.01); *H01L 23/4952* (2013.01); *H01L 23/49582* (2013.01); *H01R 12/585* (2013.01)

(58) Field of Classification Search
   CPC ........... H01L 23/49541; H01L 23/3107; H01L 23/4952; H01L 23/49582; H01L 21/563; H01R 12/585; H01R 13/052
   See application file for complete search history.

(56) References Cited

U.S. PATENT DOCUMENTS

| | | | | |
|---|---|---|---|---|
| 4,992,987 A | * | 2/1991 | Echols ................... | G11C 5/141 257/E23.058 |
| 5,557,504 A | * | 9/1996 | Siegel .................... | H01L 23/58 174/250 |
| 5,570,273 A | * | 10/1996 | Siegel .................... | H01L 23/58 174/261 |
| 5,761,050 A | * | 6/1998 | Archer ................. | H01R 12/585 361/744 |

(Continued)

OTHER PUBLICATIONS

Jose Becerra, Dennis Willie and Murad Kurwa, "Press Fit Technology Roadmap and Control Parameters for a High Performance Process," IPC APEX EXPO Conference Proceedings, Oct. 27, 2016.

*Primary Examiner* — Earl N Taylor

(57) ABSTRACT

A press-fit semiconductor device includes a lead frame having a die pad, leads with inner and outer lead ends, and a press-fit lead. The press-fit lead has a circular section between an outer lead end and an inner lead end, and the circular section has a central hole that is sized and shaped to receive a press-fit connection pin. A die is attached to the die pad and electrically connected to the inner lead ends of the leads and the inner lead end of the press-fit lead. The die, electrical connections and inner lead ends are covered with an encapsulant that forms a housing. The outer lead ends of the leads extend beyond the housing. The housing has a hole extending therethrough that is aligned with the center hole of the press-fit lead, so that a press-fit connection pin can be pushed through the hole to connect the device to a circuit board.

20 Claims, 3 Drawing Sheets

(56) References Cited

U.S. PATENT DOCUMENTS

| | | | | |
|---|---|---|---|---|
| 6,305,949 | B1 * | 10/2001 | Okuyama | H01R 12/585 |
| | | | | 439/75 |
| 6,494,734 | B1 * | 12/2002 | Shuey | H01R 12/727 |
| | | | | 439/378 |
| 6,846,186 | B2 * | 1/2005 | Lao | H01M 2/1022 |
| | | | | 257/924 |
| 7,148,082 | B1 * | 12/2006 | Lin | H01L 21/4832 |
| | | | | 438/106 |
| 7,683,494 | B1 * | 3/2010 | Stortini | H01L 23/13 |
| | | | | 257/668 |
| 8,317,525 | B2 * | 11/2012 | Bayerer | H01R 12/585 |
| | | | | 439/75 |
| 9,431,733 | B1 * | 8/2016 | Heistand | H01R 43/16 |
| 2017/0110843 | A1 * | 4/2017 | Chew | H01R 13/415 |

* cited by examiner

PRESS-FIT SEMICONDUCTOR DEVICE

BACKGROUND

The present invention relates generally to semiconductor devices and semiconductor device packaging and, more particularly, to a semiconductor device with a through hole that allows the device to be press-fit to another device, like a printed circuit board.

Press-fit technology is a proven and widely used and accepted interconnection method for joining electronics assemblies. Press-fit technology is used in socket insertion applications with print circuit boards (PCB), where PCB assemblies and functional sub-assemblies are electrically and mechanically connected with press-fit connectors using press-fit compliant pins. Press-fit compliant pins are used on backplanes, mid-planes and daughter card PCB assemblies to overcome challenges associated with soldering, rework, thermal cycles, installation and repair.

However, the PCB platform has a size disadvantage. It is difficult to reduce the footprint of a PCB platform for small applications like remote motion sensing or pressure sensing in a vehicle. Also, the PCB is higher cost than an alloy lead-frame based device. Thus, it would be advantageous to be able to adapt press-fit technology to lead-frame based devices.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 3:
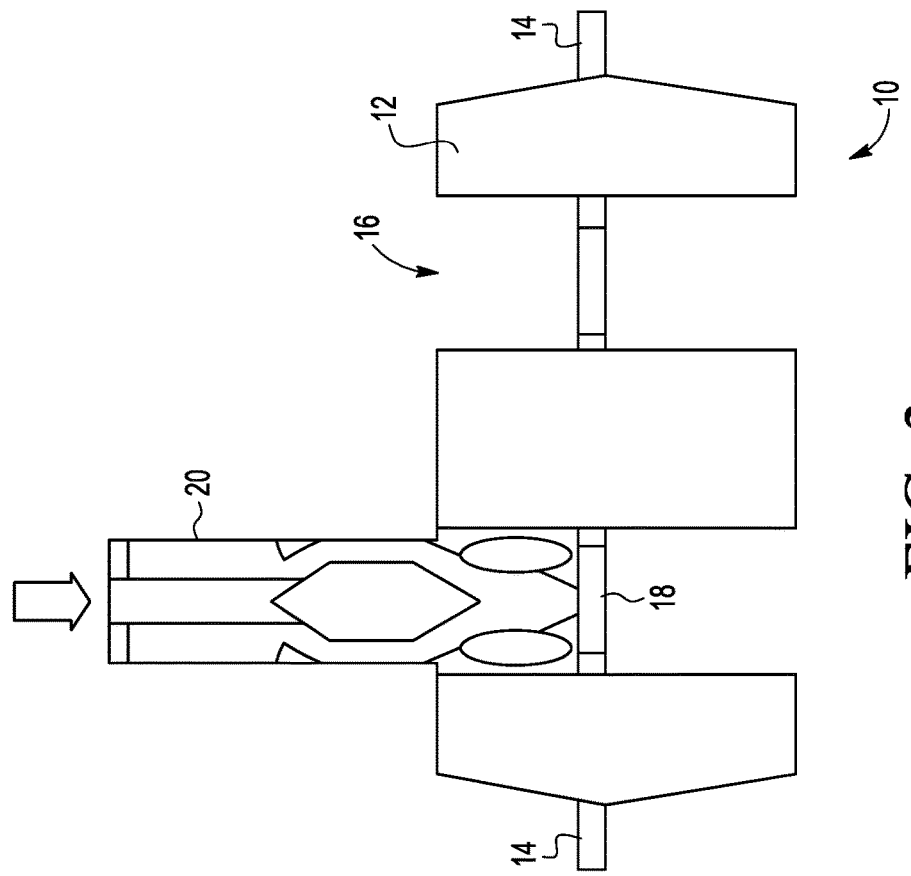
FIG. 3 is a cross-sectional side view of the semiconductor device of FIGS. 1 and 2 with a male press-fit connector pin being inserted therein.

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. The drawings are not necessarily to scale, as some elements may be relatively smaller or larger than other elements, with such differences being to highlight the features of the invention. The terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The present invention is applicable to pluggable semiconductor devices. The present invention provides a package design solution that has hole through the package to allow devices to be press-fit using a standard male pin and thus be directly pluggable with a female socket without the need for any PCB. A key feature of the invention is a through-hole integrated into a semiconductor package through which the press-fit connection pin can be inserted for connection to a female socket. The press-fit hole is pre-fabricated in an alloy lead frame and the plastic epoxy mold compound using standard semiconductor package molding processes to create the holes in the package body.

In one embodiment, the present invention is a lead frame having an outer frame, a die pad located within the outer frame, and a first plurality of leads that are generally perpendicular to a first side of the die pad and a first side of the outer frame. Each lead of the first plurality of leads has an inner lead end that is spaced from but near to the first side of the die pad and an outer lead end that is attached to the first side of the outer frame. There is at least one tie bar extending from the first side of the outer frame to the first side of the die pad to provide support to the die pad. There also is a first press-fit lead extending from a second side of the outer frame towards a second side of the die pad. The first press-fit lead includes a first arm having a first end that is integral with the second side of the outer frame, a circular section extending from a second end of the first arm, and an inner lead end that extends from the circular section towards the second side of the die pad. The circular section has a center hole formed therein that is sized to receive a male press-fit connection pin.

In yet another embodiment, the present invention provides a method of assembling a press-fit semiconductor device. The method includes providing a lead frame having an outer frame, a die pad located within the outer frame, and a plurality of leads that are generally perpendicular to a first side of the die pad and a first side of the outer frame. Each lead of the leads has an inner lead end that is spaced from but near to the first side of the die pad and an outer lead end that is attached to the first side of the outer frame. There is at least one tie bar extending from the first side of the outer frame to the first side of the die pad to provide support to the die pad. A press-fit lead extends from a second side of the outer frame towards a second side of the die pad. The press-fit lead includes a first arm having a first end that is integral with the second side of the outer frame, a circular section extending from a second end of the first arm, and an inner lead end that extends from the circular section towards the second side of the die pad. The circular section has a center hole formed therein that is sized to receive a press-fit connection pin. An integrated circuit (IC) die is attached to the die pad of the lead frame and electrically connected the die to the inner lead ends of the leads and to the inner lead end of the first press-fit lead. The method further includes encapsulating the die, the electrical connections, and the lead frame with a plastic molding compound. A hole is formed in the molding compound that is aligned with the center hole of the press-fit lead. Finally, the outer frame is trimmed, wherein the outer lead ends of the first plurality of leads extend beyond an outer edge of the molding compound to enable the die to communicate with an external device.

Figure 1:
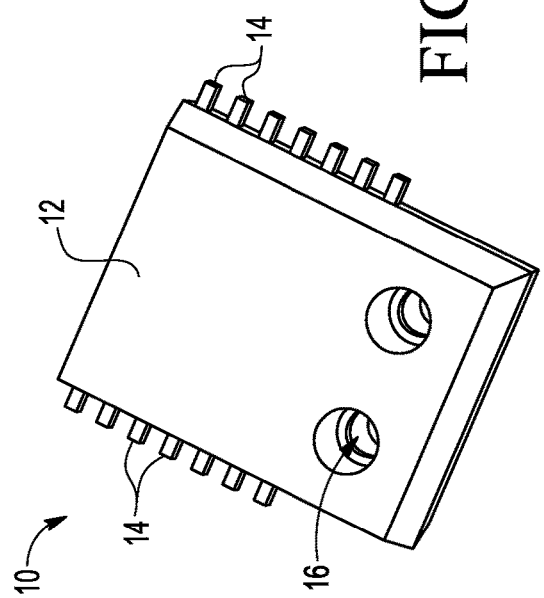
FIG. 1 is a perspective view of a semiconductor device in accordance with an embodiment of the present invention.
Figure 2:
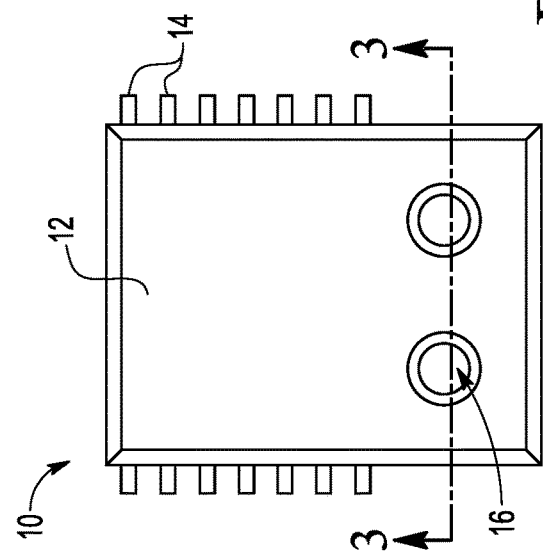
FIG. 2 is a top plan view of the semiconductor device of FIG. 1.

Referring now to FIGS. 1 and 2, perspective and top views of a packaged semiconductor device 10 in accordance with an embodiment of the present invention are shown. The semiconductor device 10 has a housing 12 formed with a plastic mold compound and a plurality of leads 14 that extend outwardly from the housing 12. The semiconductor device 10 may house various kinds of integrated circuits, such as a power device, an application specific IC (ASIC), etc., and the leads 14, although shown as extending straight out of two opposing sides of the device 10, may extend from one, two, three, or even all four sides of the device 10. Moreover, the leads 14 may be bent into different shapes, such as J-leads or Gull Wing leads. The housing 12 also has a pair of press-fit holes 16 that extend entirely through the housing 12. Although two press-fit holes 16 are shown side-by-side at one end of the device 10, it will be understood by those of skill in the art that there could be more or fewer than two press-fit holes 16, and that the holes 16 need not be placed side-by-side at one end, but could be spaced, for instance, one at each end (i.e., located at opposing ends of the package).

FIG. 3 is a cross-sectional side view of the device 10 cut along line 3-3 in FIG. 2 with a press-fit pin 20 being inserted into one of the holes 16, except that behind the holes is shown as blank space, simply for clarity, as in a real cross-section you would see the opposite sides of the holes 16, so it would be difficult to see how the male pin can be inserted into the hole. The device 10 is a lead-frame-based device, so a portion of a lead frame 18 used to assemble the device is visible. The holes 16 are sized and shaped to receive a male connection pin like the male connection pin 20. As various size and types of press-fit connection pins are commercially available, it will be understood by those of skill in the art that the holes for a particular package are sized and shaped to receive a pre-selected pin. Thus, the inner diameter of the holes will vary depending on the pre-selected pin. The package thickness (i.e., the thickness of the housing 12) also may be a factor either in pin selection or package thickness specification.

Figure 4:
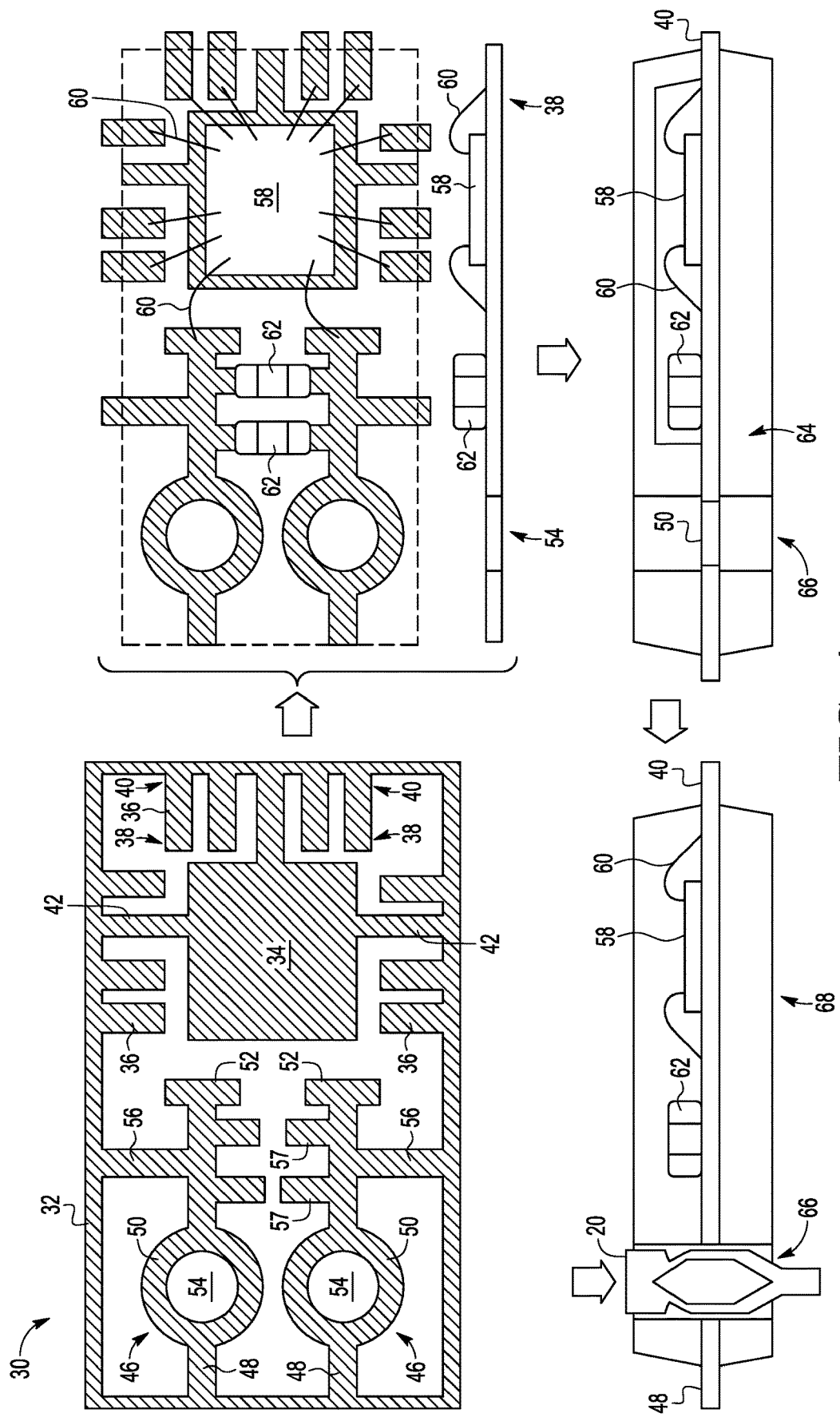
FIG. 4 illustrates a series of steps for assembling the semiconductor device of FIGS. 1-3.

FIG. 4 is a series of figures illustrating the assembly of a press-fit semiconductor device like the device 10. At the upper left side of FIG. 4, a top plan view of a lead frame 30 in accordance with an embodiment of the present invention is shown. The lead frame 30 has an outer frame 32, a die pad 34 located within the outer frame 30, and a plurality of leads 36 that are generally perpendicular to respective sides of the die pad 34 and respective sides of the outer frame 32. More particularly, each lead 36 has an inner lead end 38 that is spaced from but near to the respective side of the die pad 34 and an outer lead end 40 that is attached to a respective side of the outer frame 32. One or more tie bars 42 extend from respective sides of the outer frame 32 to the die pad 34 to provide support to the die pad 34. The lead frame 30 and the die pad 34 both are generally rectangular, but those are not requirements, as either could take on various shapes, as desired. The leads 36 are disposed on three sides of the die pad 34, but that also is not a requirement, as the leads 36 could extend from just two sides (see device 10 of FIG. 1) or even just one side.

The lead frame 30 also includes one or more press-fit leads 46 (two in the embodiment shown) extending from at least one side of the outer frame 32 towards the die pad 34. Each of the press-fit leads 46 includes a first arm 48 having a first end that is integral with the outer frame 32, a circular section 50 that extends from a second end of the first arm 48, and an inner lead end 52 that extends from the circular section 50 towards the die pad 34. The circular section 50 has a center hole 54 formed therein that is sized to receive a press-fit connection pin like the connection pin 20 shown in FIG. 3.

In one embodiment, the inner lead ends 52 of the press-fit leads 46 are T-shaped. The press-fit leads 46 also may include a second arm 56 that extends perpendicularly from the inner lead end 52 to an adjacent side of the outer frame 32. In another embodiment, the press-fit leads 46 also include one or more third arms 57 (two are shown in this embodiment) that extend perpendicular from the inner lead ends 52. The third arms 57 are spaced from complementary third arms on an adjacent press-fit lead. The complementary third lead arms 57 may be used to receive opposing ends of a passive device, as discussed below.

The lead frame 30 preferably is formed from a copper sheet by punching, stamping, cutting or etching, as is known in the art, and the underlying metal (e.g., Cu), may be plated with one or more other metals or an alloy, such as Ni, Pd, and Au.

Moving to the upper right side of FIG. 4, an integrated circuit die 58 is attached to the die pad 34 and electrically connected to the inner lead ends 38 of the leads 36. The die 58 may be attached to the die pad 34 using known die attach methods, including solder, glue, or tape. In the embodiment shown, bond wires 60 are used to connect the bonding pads (not shown) on an active surface of the die 58 to the inner lead ends 38. However, if a flip-chip die is used, then the die could rest atop of the leads with the die bonding pads directly connected to the inner leads ends, such as with conductive bumps or balls. The T-shaped inner lead ends 52 of the press-fit leads 46 also may be electrically connected to the die 58.

In one embodiment, a passive device 62 is mounted on the lead frame 30 and spans the third arms 57 of adjacent press-fit leads 46. In the embodiment shown, each of the press-fit leads 46 has two adjacent third arms 57 that are spaced from complementary third arms on the adjacent press-fir lead such that two passive devices 62 are mounted on the lead frame 30, as shown. The passive devices 62 may comprise resistors, capacitors, inductors, etc., as is known in the art.

After the die 58 and any passive devices 62 are attached to the lead frame 30 and electrically connected, an encapsulant 64 is formed over the integrated circuit die 58, the electrical connections between the integrated circuit die 58 and the leads 36, and the lead frame 30. The encapsulant 64 forms a body. An outline of the body is shown with dashed lines on the top right of FIG. 4, while the encapsulant 64 is shown on the bottom left and right sides. Press-fit holes 66 are formed in the encapsulant 64, preferably using known transfer molding techniques. The press-fit holes 66 formed in the housing are aligned with the center holes 54 in the press-fit leads 46 so that a press-fit connection pin 20 (bottom left drawing of FIG. 4) can be inserted therein and extend entirely through the housing. In one embodiment, a diameter of the press-fit hole 66 in the housing is greater than a diameter of the center hole 54 of the press-fit lead 46. For example, in one embodiment the center hole 54 is 1.05 mm and the press-fit hole is 1.5 mm.

Figure 5:
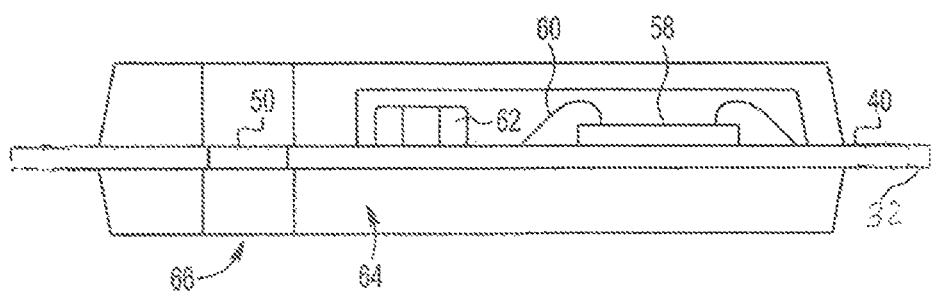
FIG. 5 shows a cross-sectional view of a semiconductor device attached to an outer frame.

FIG. 5 shows a cross-sectional view of a semiconductor device attached to outer frame 32 prior to trimming and forming.

As will be understood by those of skill in the art, trim and form processes are performed in which the outer frame 32 is cut away and the outer lead ends 40 of the leads 36 extend beyond an outer edge of the housing, thereby providing a packaged semiconductor device 68. The outer leads ends (i.e., the first arm 48 and the second arm 56) of the press-fit leads 46 may or may not extend beyond the outer edge of the housing depending on design requirements.

In some drawings or parts of drawings, the encapsulant 64 may be shown as transparent, but this is just so that the underlying components of the assembly may be visualized. The encapsulant 64 typically is non-transparent.

As will now be apparent, the present invention provides integration of a press-fit hole into a semiconductor package, which can eliminate the need for a PCB, thus saving both area and cost. Further, integrating the hole into a semiconductor package allows for reduced material cost and fewer process steps. For example, if the holes were drilled into the semiconductor device, the drilling would be an extra process step and the drilled encapsulant would be wasted material.

The present invention is applicable to any lead frame material including Cu, pre-plated Cu, and for any alloy, solder, or conductive material used for connecting components, e.g., a capacitor, resistor, or inductor to the lead frame. The present invention is applicable to any plastic mold compound for conventional and new semiconductor packages. The invention also is applicable to any press-fit pin diameter and any press-fit hole diameter. That is, it will be understood that the sizes and shaped of the holes formed in the packaged device may vary depending on the size and shape of the press-fit connection pin.

Unless explicitly stated otherwise, each numerical value and range should be interpreted as being approximate as if the word "about" or "approximately" preceded the value or range.

It will be further understood that various changes in the details, materials, and arrangements of the parts that have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An article of manufacture, comprising:
   a lead frame having an outer frame, a die pad located within the outer frame, a first plurality of leads that are generally perpendicular to a first side of the die pad and a first side of the outer frame, each lead of the first plurality of leads having an inner lead end that is spaced from but near to the first side of the die pad and an outer lead end that is attached to the first side of the outer frame, at least one tie bar extending from the first side of the outer frame to the first side of the die pad to provide support to the die pad, and a first press-fit lead extending from a second side of the outer frame towards a second side of the die pad, wherein the first press-fit lead includes a first arm having a first end that is integral with the second side of the outer frame, a circular section extending from a second end of the first arm, and an inner lead end that extends from the circular section towards the second side of the die pad, wherein the circular section has a center hole formed therein, and wherein the center hole is sized to receive a press-fit connection pin.

2. The article of claim 1, wherein the inner lead end of the first press-fit lead is T-shaped.

3. The article of claim 2, wherein the first press-fit lead includes a second arm that extends perpendicularly from the inner lead end to a third side of the outer frame.

4. The article of claim 1, further comprising a second press-fit lead adjacent to the first press-fit lead, the second press-fit lead including a second arm having a first end that is integral with the second side of the outer frame, a second circular section extending from a second end of the second arm, and an inner lead end that extends from the second circular section towards the second side of the die pad, and wherein the second circular section has a second center hole formed therein that is sized to receive a press-fit connection pin.

5. The article of claim 4, wherein the lead frame includes a second plurality of leads that are generally perpendicular to a third side of the die pad and the third side of the outer frame, each lead of the third plurality of leads having an inner lead end that is spaced from but near to the third side of the die pad and an outer lead end that is attached to the third side of the outer frame, and a second tie bar extending from the third side of the die pad to the third side of the outer frame to provide support to the die pad.

6. The article of claim 5, wherein the lead frame includes a third plurality of leads that are generally perpendicular to a fourth side of the die pad and a fourth side of the outer frame, each lead of the fourth plurality of leads having an inner lead end that is spaced from but near to the fourth side of the die pad and an outer lead end that is attached to the fourth side of the outer frame, and a third tie bar extending from the fourth side of the die pad to the fourth side of the outer frame to provide support to the die pad.

7. The article of claim 1, wherein the outer frame and the die pad are rectangular.

8. The article of claim 1, wherein the article comprises the lead frame, and the lead frame comprises copper plated with a non-corrosive metal.

9. The article of claim 1, further comprising:
   an integrated circuit die attached to the die pad and electrically connected to the inner lead ends of the first plurality of leads; and
   an encapsulant formed over the integrated circuit die, the electrical connections between the integrated circuit die and the first plurality of leads, and the lead frame, wherein the encapsulant forms a body, and wherein a press-fit hole is formed in the encapsulant, said press-fit hole being aligned with the center hole in the press-fit lead so that a press-fit connection pin can be inserted therein and extend entirely through the article.

10. A press-fit semiconductor device, comprising:
   a die pad;
   a first plurality of leads that are generally perpendicular to a first side of the die pad, each lead of the first plurality of leads having an inner lead end that is spaced from but near to the first side of the die pad and an outer lead end that is further spaced from the die pad;

a first press-fit lead spaced from and extending away from a second side of the die pad, wherein the first press-fit lead includes a first arm having a first end that is distal from the die pad, a circular section extending from a second end of the first arm, and an inner lead end that extends from the circular section towards the second side of the die pad, wherein the circular section has a center hole formed therein, and wherein the center hole is sized to receive a press-fit connection pin;

an integrated circuit die attached to the die pad and electrically connected to the inner lead ends of the first plurality of leads and the inner lead end of the first press-fit lead; and an encapsulant formed over the integrated circuit die, the electrical connections between the integrated circuit die and the inner lead ends of the first plurality of leads, the inner lead end of the press-fit lead, and the circular section of the press-fit lead, wherein the encapsulant forms a body, and wherein a press-fit hole is formed in the encapsulant that is aligned with the center hole in the press-fit lead so that a press-fit connection pin can be inserted therein and extend entirely through the press-fit device.

11. The press-fit device of claim 10, wherein a diameter of the press-fit hole is greater than a diameter of the center hole of the press-fit lead.

12. The press-fit device of claim 10, wherein the integrated circuit die is electrically connected with the leads with bond wires.

13. The press-fit device of claim 10, further comprising:
a second press-fit lead adjacent to the first press-fit lead, wherein each of the first and second press-fit leads includes a second arm extending from the inner lead end towards the second arm of the adjacent press-fit lead; and
a passive device spanning and electrically connected to the second arms of the first and second press-fit leads, wherein the passive device is covered by the encapsulant.

14. A method of assembling a press-fit semiconductor device, comprising:
providing a lead frame having an outer frame, a die pad located within the outer frame, a plurality of leads that are generally perpendicular to a first side of the die pad and a first side of the outer frame, wherein each lead has an inner lead end that is spaced from but near to the first side of the die pad and an outer lead end that is attached to the first side of the outer frame, at least one tie bar extending from the outer frame to the die pad to provide support to the die pad, and a first press-fit lead extending from a second side of the outer frame towards a second side of the die pad, wherein the first press-fit lead includes a first arm having a first end that is integral with the second side of the outer frame, a circular section extending from a second end of the first arm, and an inner lead end that extends from the circular section towards the second side of the die pad, wherein the circular section has a center hole formed therein, and wherein the center hole is sized to receive a press-fit connection pin;

attaching an integrated circuit (IC) die to the die pad of the lead frame;

electrically connecting the IC die to the inner lead ends of the plurality of leads and to the inner lead end of the first press-fit lead;

encapsulating the IC die, the electrical connections and the lead frame with a molding compound, wherein during the encapsulation, a hole is formed in the molding compound that is aligned with the center hole of the press-fit lead; and trimming the lead frame, wherein the outer frame is cut away and the outer lead ends of the plurality of leads extend beyond an outer edge of the molding compound to enable the IC die to communicate with an external device.

15. The method of assembling a press-fit semiconductor device of claim 14, wherein the lead frame further comprises a second press-fit lead adjacent to the first press-fit lead, wherein each of the first and second press-fit leads includes a second arm extending from the inner lead end thereof towards the second arm of the adjacent press-fit lead, and where the method further comprises:
attaching and electrically connecting a passive device across the second arms of the adjacent first and second press-fit leads, wherein the passive device is covered with the molding compound.

16. The press-fit device of claim 10 wherein the inner lead end of the first press-fit lead is T-shaped.

17. The press-fit device of claim 10 wherein the first press-fit lead includes a second arm that extends perpendicularly from the inner lead end extends outside of the body.

18. The press-fit device of claim 10 further comprising:
a second press-fit lead spaced from and extending away from the die pad, wherein the second press-fit lead includes a first arm having a first end that is distal from the die pad, a circular section extending from a second end of the first arm, and an inner lead end that extends from the circular section towards the die pad, wherein the circular section has a center hole formed therein, and wherein the center hole is sized to receive a press-fit connection pin.

19. The press-fit device of claim 18 wherein a second press-fit hole is formed in the encapsulant that is aligned with the center hole in the second press-fit lead so that a press-fit connection pin can be inserted therein and extend entirely through the press-fit device.

20. The press-fit device of claim 10 further comprising:
a second plurality of leads that are generally perpendicular to a third side of the die pad, each lead of the second plurality of leads having an inner lead end that is spaced from but near to the third side of the die pad and an outer lead end that is further spaced from the die pad.

* * * * *